United States Patent
Jokiel, Jr. et al.

(10) Patent No.: US 6,675,671 B1
(45) Date of Patent: Jan. 13, 2004

(54) PLANAR-CONSTRUCTED SPATIAL MICRO-STAGE

(75) Inventors: Bernhard Jokiel, Jr., Albuquerque, NM (US); Gilbert L. Benavides, Albuquerque, NM (US); Lothar F. Bieg, Albuquerque, NM (US); James J. Allen, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 79 days.

(21) Appl. No.: 10/153,109

(22) Filed: May 22, 2002

(51) Int. Cl.$^7$ .................................................. B25J 7/00
(52) U.S. Cl. ...................................... 74/490.09; 901/29
(58) Field of Search ...................... 74/490.01, 490.07, 74/490.09; 414/729; 901/28, 29

(56) References Cited

U.S. PATENT DOCUMENTS

| | | | | |
|---|---|---|---|---|
| 5,279,176 A | * | 1/1994 | Tahmasebi et al. | 74/490.01 |
| 5,378,282 A | * | 1/1995 | Pollard | 118/697 |
| 5,631,514 A | | 5/1997 | Garcia et al. | 310/309 |
| 5,804,084 A | | 9/1998 | Nasby et al. | 216/2 |
| 5,959,376 A | | 9/1999 | Allen | 310/40 |
| 6,082,208 A | | 7/2000 | Rodgers et al. | 74/406 |
| 6,133,670 A | | 10/2000 | Rodgers et al. | 310/309 |
| 6,175,170 B1 | | 1/2001 | Kota et al. | 310/40 |
| 6,196,081 B1 | | 3/2001 | Yau | 74/479.01 |
| 6,198,180 B1 | | 3/2001 | Garcia | 310/36 |
| 6,211,960 B1 | | 4/2001 | Hembree | 356/400 |

OTHER PUBLICATIONS

NASA "*Mesoscopic Steerable Mirror*"; Apr. 1, 2002, pp i, 1–2.
James H. Smith et al "*Microelectro–Optical Devices in a 5–Level . . .* ", Sep. 1988, pp. 42–47.
"Les robots plans/Planar robots", Mar. 19, 2002, web page at http://www–sop.inria.fr/coprin/equipe/merlet/Archi/node1.htm.
"Les robots a mouvements Spatiaux/Spatial robots", Mar. 19, 2002, web page at http://www–sop.inria.fr/coprin/equipe/merlet/Archi/node1.htm.
M. S. Rodgers, et al, "*Advanced Micromechanisms in a Multi–level Polysilicon Technology*", SPIE vol. 3224, pp. 120–131.
S. L. Miller, et al, "*Routes to Failure in Rotating MEMS Devices Experiencing Sliding Friction*", SPIE vol. 3224.

* cited by examiner

*Primary Examiner*—David A. Bucci
*Assistant Examiner*—Timothy McAnulty
(74) *Attorney, Agent, or Firm*—George H. Libman

(57) ABSTRACT

A multiple degree of freedom platform assembly formed from a plurality of thin films on a substrate can, when activated, move out of the plane of the substrate without additional manufacturing steps. The platform is connected to the substrate by at least three linkages, each linkage being pivotally connected to the platform and the base. At least two of the base connections are to powered traveling devices that are manufactured at one end of a path and which may be moved to locations along the path to cause the platform to move to predetermined positions. The entire assembly, including hinges, is manufactured as planar structures; preferably by a thin film technology such as MEMS.

23 Claims, 7 Drawing Sheets

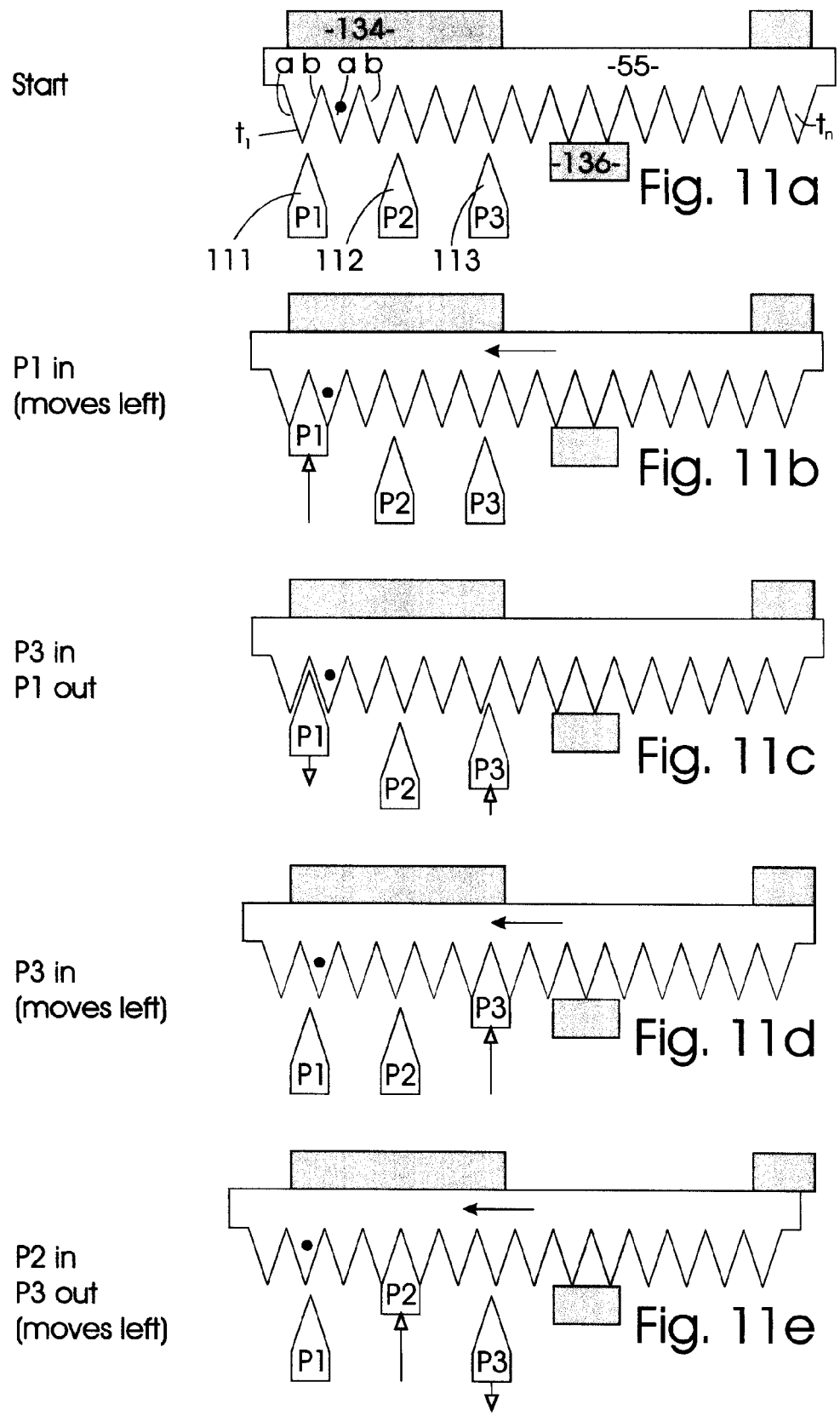

PLANAR-CONSTRUCTED SPATIAL MICRO-STAGE

CROSS REFERENCE TO RELATED APPLICATIONS (Not Applicable)

The United States Government has rights in this invention pursuant to Department of Energy Contract No. DE-AC04-94AL85000 with Sandia Corporation.

BACKGROUND OF THE INVENTION

The present invention relates generally to devices constructed using thin film technology, and more particularly to micro-stages having rigid legs connected to actuators through joints of varying degrees of freedom to provide varying ranges of motion.

Moveable stages are well-known in the field of robotics and manufacturing, and are frequently used to move a first object to a predetermined point relative to a fixed second object. For example, in manufacturing, an XY table may move a substrate relative to a nozzle in order that material may be deposited on the substrate in a predetermined pattern. And an XYZ table may be used to position a work piece relative to a tool in order that the tool may operate on a predetermined location on the work piece. D. Hembree, U.S. Pat. No. 6,211,960, describes a conventional multi-axis positioning machine for use in semiconductor manufacture.

It would be desirable to construct such devices using thin film technology such as microelectromechanical systems (MEMS) technology. Many materials are being studied for MEMS devices; for example, J. P. Sullivan et al, *Diamond and Amorphous Carbon MEMS*, *MRS Bulletin*, April 2001, pp 309–311, reports on diamond an amorphous carbon films used for MEM devices. However, the most common MEMS material at the present time is polysilicon.

Techniques for constructing MEMS devices are well known in the art. The following description by M. S. Rodgers et al., *Advanced micromechanisms in a multi-level polysilicon technology*, SPIE Vol. 3224, September 1997, pp. 120–130 provides an overview of a four level process where layers of structural polysilicon (n-type) separated by sacrificial silicon oxide layers built-up on a silicon-nitride coated, <100>, n-type 6" silicon wafer substrate. Each of the layers are patterned and etched as is commonly done in integrated circuit production, which provides the means to create complex, interconnected, micro-mechanism complete with motors and drive linkages containing spinning and translating elements with minimum features sizes of 1 $\mu$m.

The complexity of devices that can be created using surface micromachining is significantly influenced by the number of mechanical layers fabricated in the process. The four level technology available at Sandia National Laboratories, Albuquerque, NM and known as Sandia Ultra-planar Multi-level MEMS Technology (SUMMiT™) utilizes a chemical mechanical polishing technique described by R. Nasby et al., U.S. Pat. No. 5,804,084 to eliminate undesirable process artifacts generated by previous multi-level processes. Previously, the designer was constrained to defining upper level structures that were essentially isolated islands of polysilicon. Each island had to be several microns from its neighbor, which made it impractical to define close-packed electrostatic elements and intermeshing gears with reasonable geometry.

The four level process is based on a four-level polysilicon stack. Three mechanical levels of polysilicon, referred to as poly1, poly2, and poly3, are fabricated on top of a thin poly0 electrical interconnect layer. The polysilicon layers are separated by sacrificial layers of oxide that are etched away after the entire stack is fabricated. The layer thicknesses vary to allow for fabrication of different components. Poly0 is 0.3 $\mu$m, poly1 is 0.1 $\mu$m, poly2 is 1.5 $\mu$m and poly3 is 2.5 $\mu$m. The sacrificial layer between poly3 and poly 2, and layer between poly 1 and poly 0, is 2 $\mu$m, but the layer between poly2 and poly1 is 0.5 $\mu$m. In many areas, this 0.5 $\mu$m layer is removed before Poly2 is formed, so that Poly1 and Poly2 form a single 2.5 $\mu$m layer.

Subsequently, a five layer process (SUMMiT-V™) was developed at Sandia National Laboratories, as utilized in M. Rodgers et al, U.S. Pat. No. 6,082,208, the disclosure of which patent is incorporated herein by reference. For the five layer process, each of poly3 and a new poly4 are 2.25 $\mu$m, separated by a 2 $\mu$m sacrificial layer. The five layer process allows devices of additional complexity to be constructed.

Other mechanisms that pop-out of their fabrication plane are known, but they generally are controllable in one degree of freedom. Folding mirrors are one such example where two hinged planar pieces with only one end hinged to ground can be actuated to rotate out of the plane at the connecting hinge.

L. Lin et al., *Surface-Micromachined Micro-XYZ Stages for Free-Space Microoptical Bench*, IEEE Photonics Technology Letters, Vol. 9, No. 3, March 1997, pp. 345–347, discloses a surface-micromachined microoptical bench that utilizes two linearly moving tilted mirrors and a linearly moving lens to accurately position an optical spot. This reference does not disclose a mechanical platform or point that can be moved to a predetermined XYZ coordinate relative to a fixed point.

SUMMARY OF THE INVENTION

It is an object of this invention to provide a multi-legged parallel kinematic mechanism (PKM) which may be constructed in a plane using thin film technology.

It is another object of the invention to provide a stage moveable in at least three degrees of freedom and support structure which may be stowed in a plane and which rises above the plane when activated.

It is also an object of this invention to provide a fully articulated PKM constructed using thin film technology such as MEMs.

To achieve the foregoing and other objects, and in accordance with the purpose of the present invention, as embodied and broadly described herein, is a multiple degree of freedom platform formed from a plurality of thin films on a substrate, including a moveable planar platform having three connection points defining a platform triangle, the platform being capable of being moved away from the plane of the substrate. There are three fixed-length linkages capable of being moved away from the plane of the substrate. Each linkage has one end pivotally connected to one of the platform connection points through a platform joint, and each connection point is connected to only one linkage. There are also at least three linear drives, each drive including a traveling member capable of controlled movement along a linear path adjacent the substrate. Each traveling member is pivotally connected to the other end of one of the linkages through a base joint, and each linkage is connected to only one traveling member. When each of the traveling members are in a predetermined position at one end of the linear path, the linkages and platform are coplanar to and adjacent to the substrate. When any of said traveling members is in any other position along the linear path, at least the linkage connected to that member and the platform is neither coplanar to nor adjacent to the substrate.

Additional objects, advantages, and novel features of the invention will become apparent to those skilled in the art upon examination of the following description or may be learned by practice of the invention. The objects and advantages of the invention may be realized and attained as particularly pointed out in the appended claims.

BRIEF DESCRIPTION OF THE DRAWINGS

The accompanying drawings, which are incorporated in and form part of the specification, illustrate an embodiment of the present invention and, together with the description, serve to explain the principles of the invention.

FIGS. 11a–11e show the operation of a drive system for use with the invention.

DETAILED DESCRIPTION OF THE INVENTION

This invention is a family of specially designed PKMs which provide planar and spatial motion of a platform in at least two degrees of freedom (2 DOF) and which is manufactured using thin film technology such as MEMS. The PKMs consist of a platform which can be moved in space such that its position relative to a fixed point on a base can be precisely controlled. This movement is achieved through at least two independently actuated linkages connecting the base to the platform. Each linkage has one or more substantially rigid links and a joint at each end. The joints that connect the base to the linkages (base joints) may have from one to three rotational DOF and are moved along paths in the plane of the base. The joints that connect the linkages to the platform (platform joints) have two or three degrees of freedom.

Spatial devices have a platform that may move away from the plane of the base. A body in space has six DOF relative to a stationary frame: three independent, mutually orthogonal translations (X, Y, Z axes) and three independent, mutually orthogonal rotations (A, B, C), one around each of the aforementioned translation axes.

Construction of spatial PKMs may constrain some or all of the six DOFs depending on the type of desired platform motion.

The key to building a PKM using planar thin film technology is the joint design. When structures must be built in a planar configuration, it is difficult to design joints that have more than one DOF where they are ready to be deployed without an intermediate (and undesirable) manual or assembly step. Keeping the number of manufacturing layers to a minimum is also desirable, as more processes may be utilized if fewer layers are required. The following devices are preferably constructed using layers poly(1), poly(2), and poly(3) of the SUMMiT-V process. Bottom layer poly(0) provides the surface upon which the devices move; top layer poly(4) is utilized to connect the object to be moved to the device.

Figure 1:
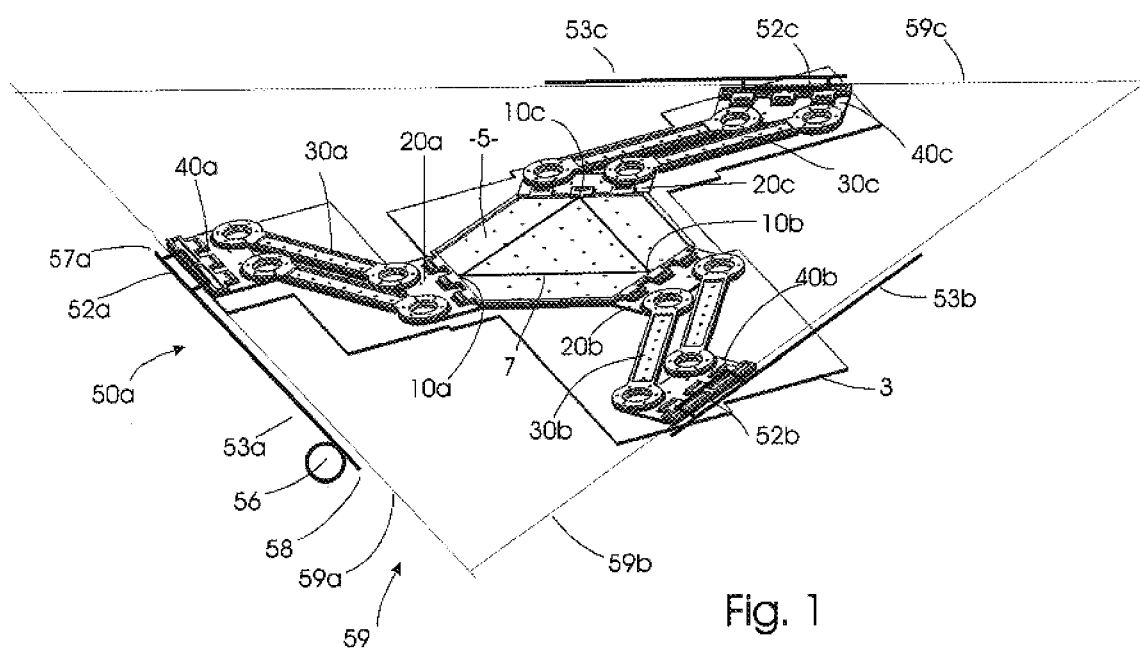
FIG. 1 shows an as-constructed device in accordance with this invention.

FIG. 1 shows a first embodiment of the invention, a platform 5 and associated activation structure which is preferably constructed on a substrate 3 by known thin film technology such as SUMMiT V™ described above. Platform 5 is "spatial", i.e., it leaves the fabrication plane and may be moved along X, Y and Z axes. However, it does not rotate.

Platform 5 has three connection points, 10a, 10b, 10c, which define a triangle 7 on either the circumference (as shown) or lower surface (not shown) of platform 5. Each connection point 10 is connected to one end of a fixed length linkage 30 by a platform joint 20. (A generic reference to a component that is associated with all linkages is by number, such as 30; a reference to a specific component is by number and letter, such as 30c.)The other end of each linkage 30 is connected through a base joint 40 to a linear drive 50 that includes a traveler 52 that is connected to platform joint 20 and which is moved along a linear path 53. Each linear path 53a, 53b, 53c lies along a corresponding leg of drive triangle 59 which is concentric and is coplanar with platform triangle 7. By concentric, it is meant that each leg of the drive triangle is parallel to one leg of the platform triangle.

The device of FIG. 1 is illustrated in the as-constructed position, i.e., all the elements are co-planar and lie where they are formed. As defined herein, a device is coplanar if it lies against the MEM substrate upon which it was constructed. If, for example, platform 5 is constructed from poly3, while each connection point 10 has elements of poly1 through poly3, these devices are still considered to be coplanar if they are lying against the substrate, as illustrated. Platform 5 ceases to be coplanar with the substrate when at least one traveler 52 moves its linkage 30 from the as-constructed position, as discussed hereinafter.

Figure 2:
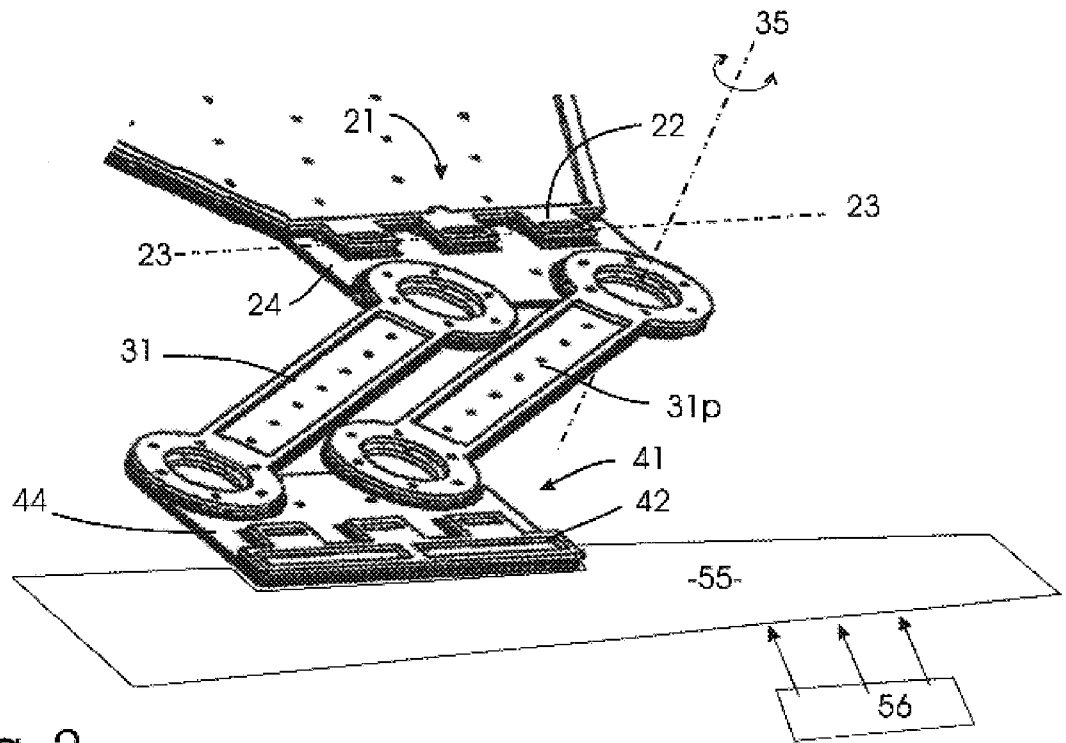
FIG. 2 shows a linkage of the device of FIG. 1.
Figure 3:
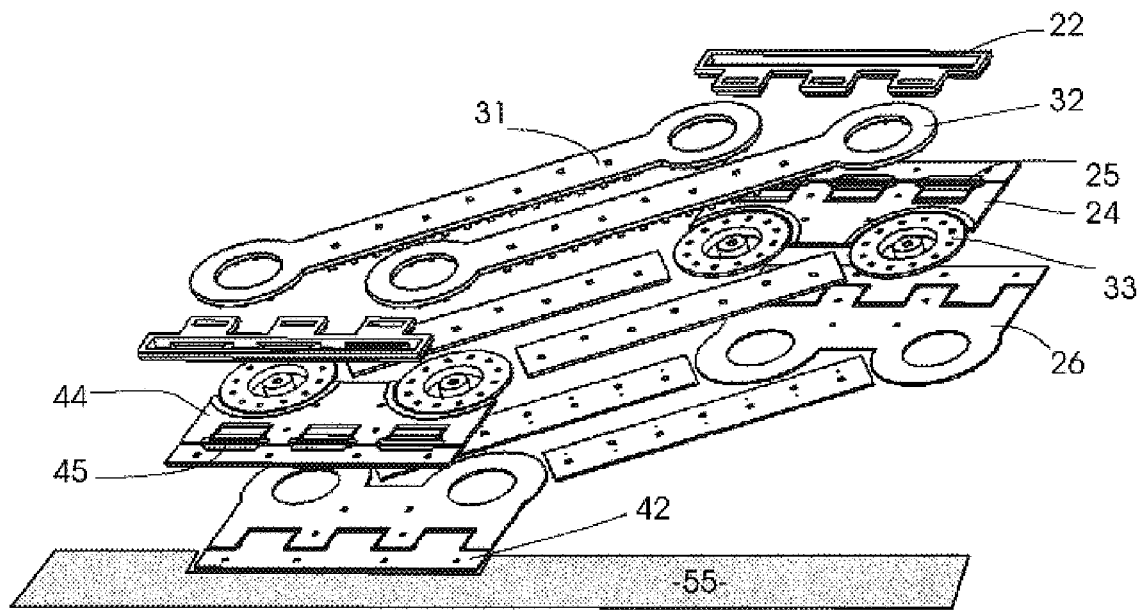
FIG. 3 shows an exploded view of the linkage of FIG. 2.

FIG. 2 shows a platform joint 20, linkage 30, and base joint 40 as utilized in FIG. 1. FIG. 3 shows a blown-apart view illustrating each of the layers from which the structure of FIG. 2 is constructed.

Each of joints 20, 40 is capable of two rotational degrees of freedom around X and Y axes which do not intersect. One part 22 of a hinge 21 is rigidly mounted to a connection point of platform 5 and a mating part 24 is connected to part 22 by pins 25 (FIG. 3) which lie along axis 23, enabling part 24 to rotate relative to part 22 along axis 23 in a manner well known in the art. Similarly, hinge 41 has one part 42 rigidly mounted to traveler 52 and a mating part 44 connected to part 42 by pins 45 which lie along axis 43, enabling part 44 to rotate relative to part 42.

Each linkage 30 includes parallel, fixed and equal length links 31, 31p that are pivotally attached at each end to hinge parts 24, 44 respectively. As seen in FIG. 3, each end of each link includes a hollow circular ring 32 fastened to a circular wheel 33 within a mating ring 26 in hinge part 24. Wheel 33 extends on both sides of ring 26 to keep it from separating from ring 26. Wheel 33 rotates about an axis 35 that is perpendicular to, and spaced from, hinge axis 23. Similar rotating structure connects base hinge part 44 to linkage 30.

The use of two parallel links 31, 31 p keeps platform 5 from rotating relative to substrate 3.

Figure 12:
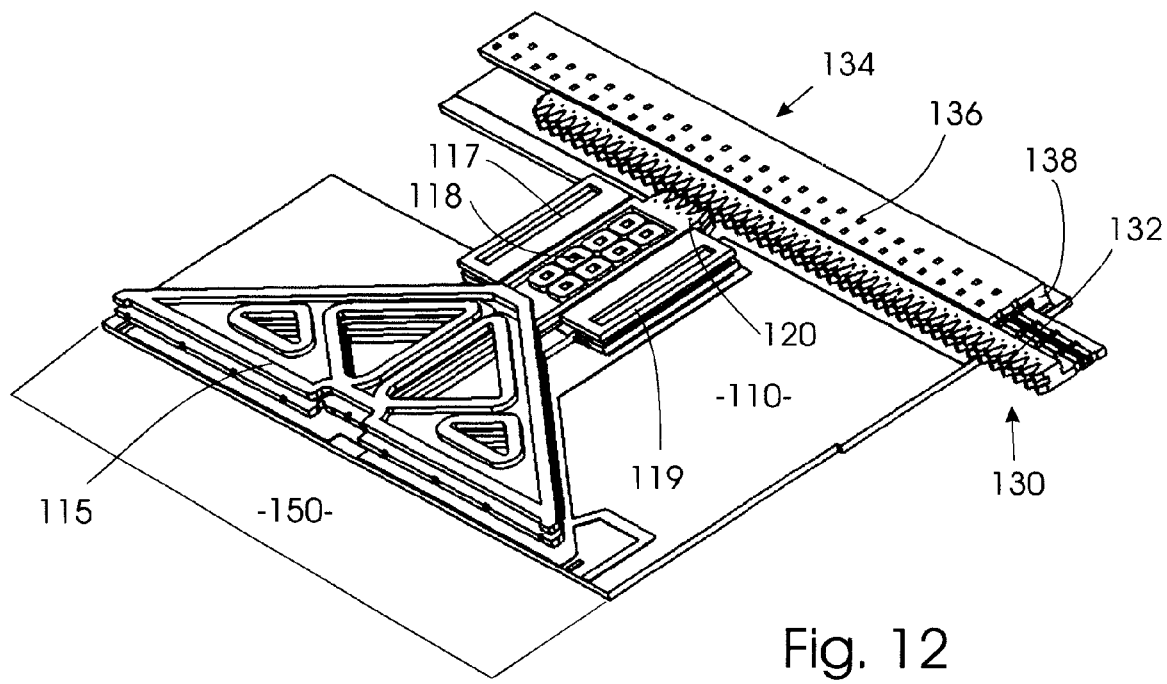
FIG. 12 shows a detail of the drive system of FIG. 11.

Each linear drive 50 can be a rack 55 to which hinge part 42 is affixed. Rack 55 slides along substrate 3 and may be driven by a gear 54 that is powered by an electrostatic motor 56. Such structure is conventional in MEMs technology, and is illustrated in the aforementioned '208 patent of Rodgers et al. An alternative linear drive structure which may be utilized in the invention is shown by J. Allen, U.S. Pat. No. 5,959,376. An alternative to the Allen structure is shown in FIGS. 11 and 12. The use of any drive mechanism that accurately moves linear drive 50 to predictable and controlled positions is contemplated in the practice of this invention.

Figure 4:
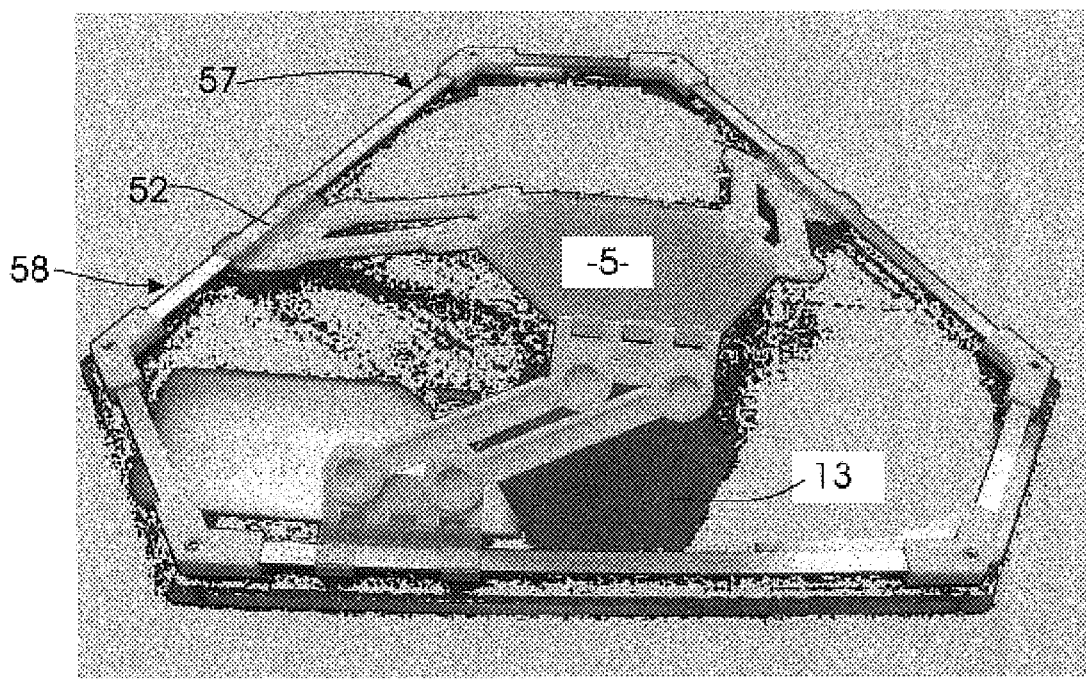
FIG. 4 shows the device of FIG. 1 in another position.

The operation of the embodiment of FIG. 1 maybe understood in conjunction with FIG. 4, which is a photograph of a model of the invention and shows platform 5 raised from the substrate. Each traveler 52 may move from one end 57 of rack 55 to an opposite end 58. As shown in FIG. 1, when all travelers 52 are at end 57, the device is planar. However, if one or more travelers 52 are moved to a position closer to end 58, then platform 5 must raise from substrate 3 in order that the distance between hinges 21 and 41 remains constant. For example, if each traveler 52a, 52b, and 52c moves its respective hinge 41a, 41b, 41c from end 57 toward end 58 of rack 55, platform 5 must raise from the surface of substrate 3 as shown by shadow 13 in FIG. 4. The disclosed linkages keep platform 5 parallel to substrate 3. Any combination of positions of travelers 52 along their respective path 53 define a distinct XYZ position of platform 5 that may be repeated by merely moving the travelers to those positions.

The embodiment of FIG. 1 has been constructed using SUMMiT-V with each device covering an area of approximately 1–3 mm$^2$. The diameter of platform 5, and the length of each linkage, was on the order of 200 µm. Motion was controlled by three linear-stepper motors as shown in FIGS. 11, 12 having a 2 µm minimum step.

The platform of the embodiment of FIGS. 1–4 moves according to XYZ translational motion. It will be recognized by those skilled in kinematic arts that other motions of platform 5 are possible if other combinations of legs and hinges are employed. However, in accordance with the invention, these hinges and legs must also be capable of being built in a plane in the manner disclosed above.

Figure 5:
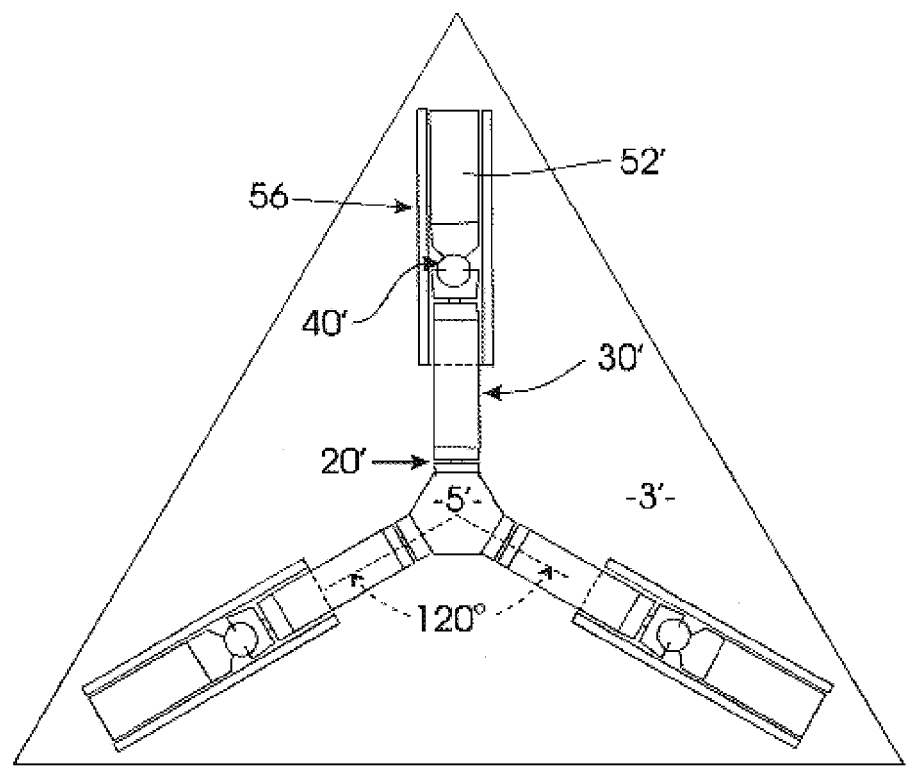
FIG. 5 shows an as-built view of a second embodiment of the invention.

FIG. 5 shows an as-constructed view of a second embodiment of the invention having a base 3' that is connected to a platform 5' through three linkages 30'. For this device, each base joint 40' has two rotational degrees of freedom (A and C) around intersecting X, Z axes, and it may be moved in a conventional manner by a traveler 52' in a groove 56 along the Y axis. Each platform joint 20' has two rotational degrees of freedom (A and B) around intersecting X, Y axes. The construction of these joints is set forth below. The path of each groove 56 is a straight line radiating outwards from a central point under platform 5', with each groove being spaced from each adjacent groove by 120°.

Figure 6:
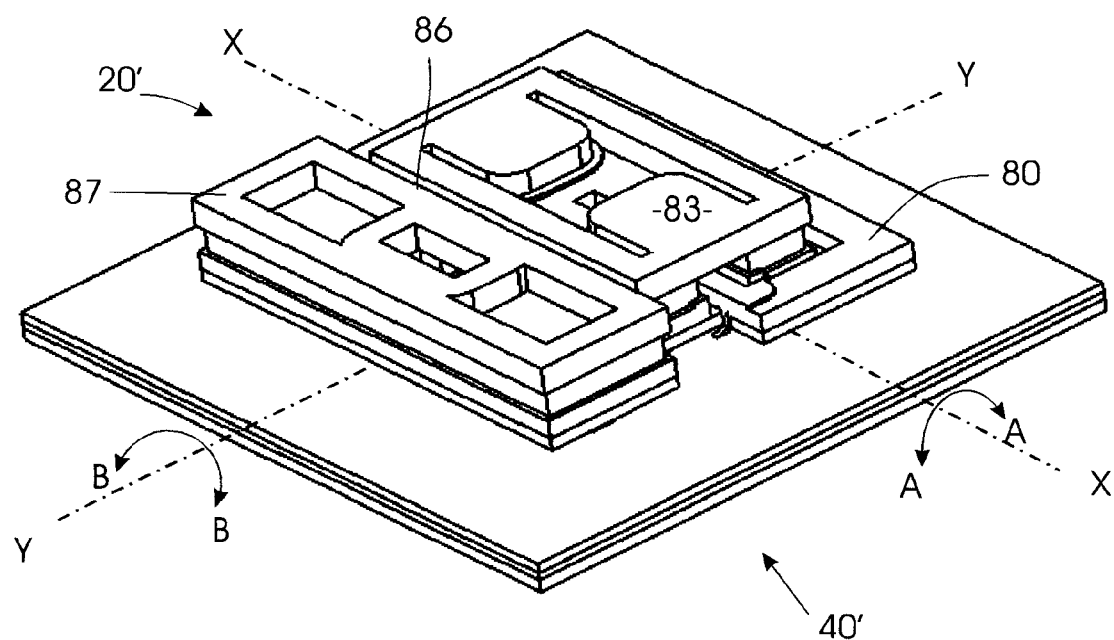
FIG. 6 shows an as-built view of the platform joint of the embodiment of FIG. 5.
Figure 7:
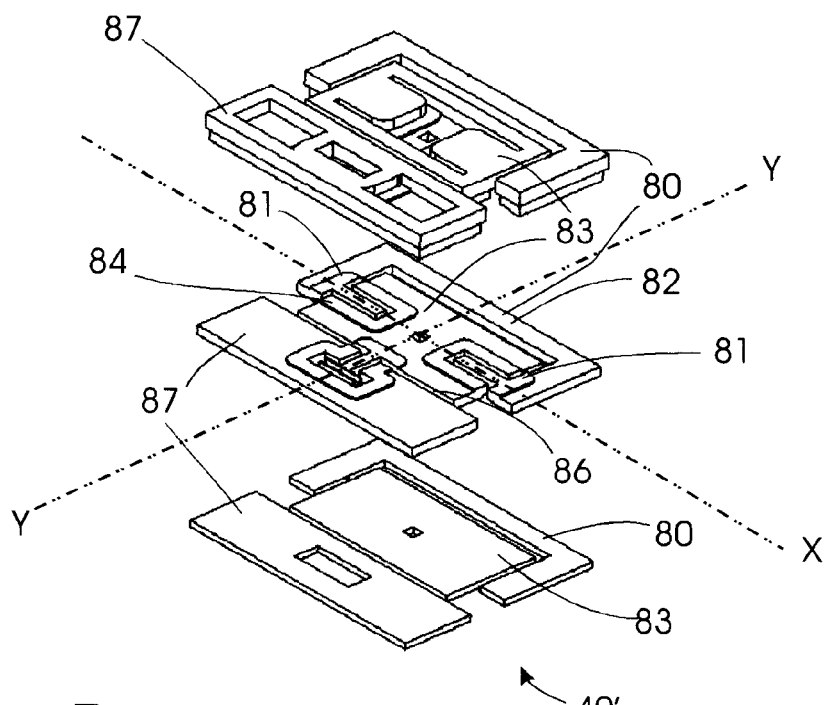
FIG. 7 shows an exploded view of the joint of FIG. 6.

Platform joint 20' is shown in FIGS. 6 and 7 to include a yolk 80 that has opposed pins 81 facing each other from opposed ends. Cross-member 82 of yolk 80 is rigidly connected to a link 31' of linkage 30'.

The remainder of platform joint 20' pivots about pins 81 along the X axis and includes a pin structure 83, and pockets 84 on opposed sides for receiving pins 81. Pin structure 83 also has a pin 85 that extends along the Y axis from a midpoint of a connecting side 86. A pivoting member 87 has a pocket 88 for receiving pin 85 and is connected to platform 5'. Yolk 80 is sized to fit over and not touch receiving structure 80, except at pins 81.

In operation, pivoting member 87 (and platform 5') may pivot around the Y axis and, because of its connection to receiving structure 83 and yolk 80, also pivot around the X axis. This joint assembly is preferably manufactured using the upper layers of thin film technology such as SUMMiT-V at one end of each link 31'. The layers shown in FIG. 7 enable this construction by one of ordinary skill in thin film manufacturing art.

Figure 8:
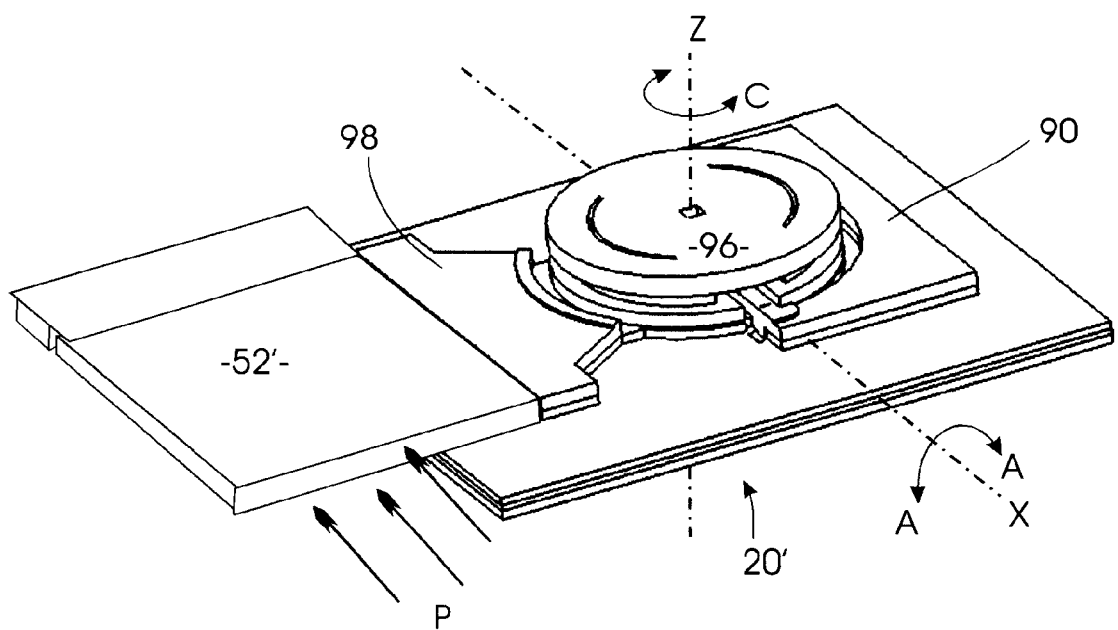
FIG. 8 shows an as-built view of the base joint of the embodiment of FIG. 5.
Figure 9:
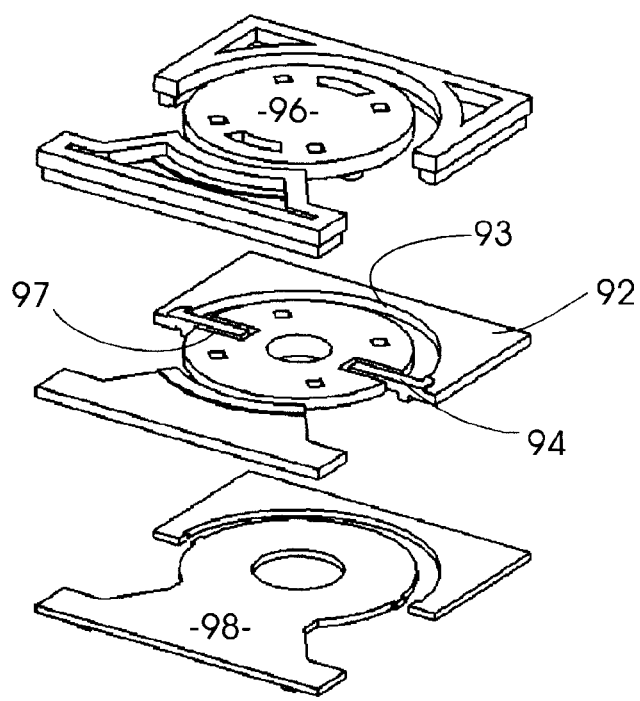
FIG. 9 shows an exploded view of the joint of FIG. 8.

Base joint 40' is shown in FIGS. 8 and 9 to include a yolk 90 which has an outer edge 91 for connection to a base end of link 30', a pair of spaced end portions 92, a pair of opposed pins 94 extending toward each other along the X' axis, and a curved inner edge 93. Pins 94 are rotatably carried in pockets 97 on opposed sides of a button 96 that has a portion (not shown) which extends through a hole in flange 98 and enlarged in a matter known in the art to enable button 96 to be rotatably attached to flange 98. As in the previous embodiment, flange 98 is rigidly attached to a traveler 52' that is attached to a sliding member 55' driven by a plurality of pushers P as discussed in FIGS. 11 and 12.

The embodiment of FIG. 5 has six joints, each with two DOF. However, since the base joint and platform joints rotate around different orthogonal axes, platform 5' can execute independently controllable movement along X,Y,Z axes as well as two rotational DOF, tip and tilt.

Figure 10:
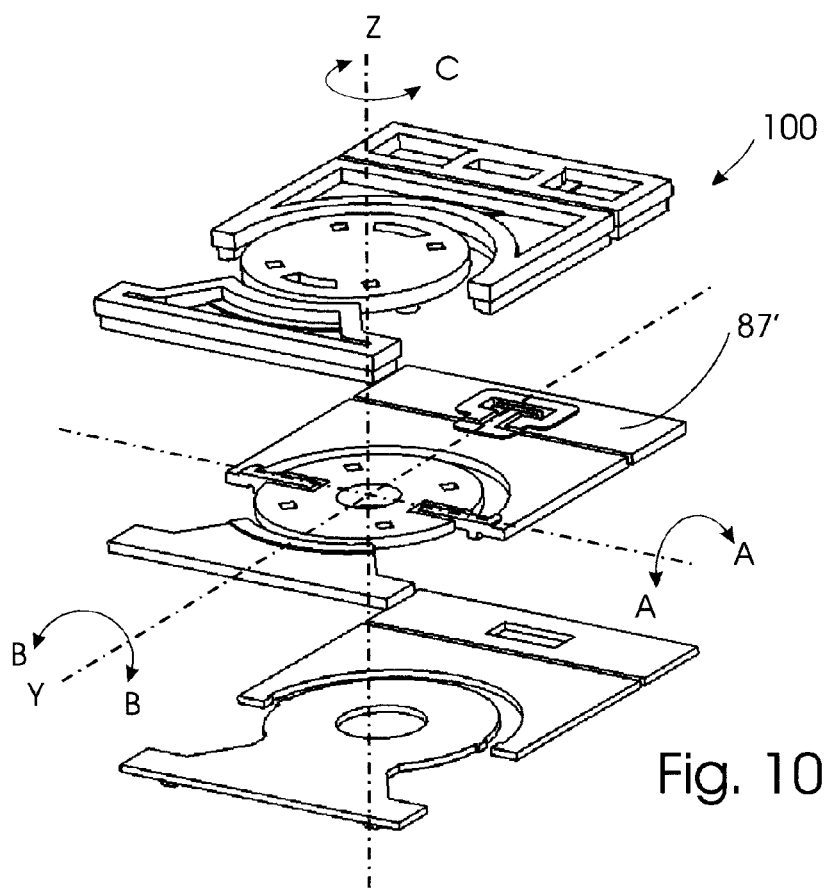
FIG. 10 shows an exploded view of a spherical joint in accordance with this invention.

FIG. 10 shows an exploded view of another joint 100 in accordance with this invention. Joint 100 takes the structure of joint 20', described above and in FIGS. 8 and 9, and adds a pivoting member 87' as shown with joint 40'. Pivoting member 87' rotates about a Y axis which is orthogonal to, and intersects, both the X and Z axes. This joint, which may be constructed using thin film technology as described above, functions as a ball joint with rotation around three orthogonal axes. If this joint 100 is used as the base joint in the system of FIG. 5, and if a simple hinge joint is used as the platform joint, the resulting platform would execute motion in a spherical coordinate frame relative to the intersection of the guideway lines of action.

FIG. 11a shows a drive for rack 55 which is related to the drive of the aforementioned Allen '376 patent. Rack 55 has a plurality of spaced teeth $t_1$–$t_n$, each tooth preferably forming an isosceles triangle, each side of each tooth being identified by an 'a' or 'b'. The rack is moved by at least three pushers, P1–P3, which have triangular points 111–113 which face and selectively contact the sides a, b of the teeth t. Rack 55 is constrained to linear movement by a block or plurality of blocks 134 on one side of rack 55 and block 136 on the tooth side. Each pusher may be moved by a conventional electrostatic comb actuator (not shown), as discussed in M. Steven Rodgers et al., U.S. Pat. No. 6,133,670, from the resting position illustrated in FIG. 11a to contact rack 55 as illustrated with pusher P1 in FIG. 11b.

The spacing of pushers P1–P3 is critical for this drive. As shown in FIG. 11a, when point 111 of P1 is aligned to make contact with a side b, point 113 of P3 would make contact with a side a of another tooth, and point 112 of P2 would be between two teeth. The alignment of the pushers is critical and depends on the number of pushers. For the disclosed three pushers, P1 is aligned t ⅙ of the linear distance from one tooth to the adjacent tooth. P2 is aligned midway between two teeth, and P3 is aligned ⅚ of the linear distance between another two adjacent teeth.

To move rack 55 to the left, P1 is actuated. As shown in FIG. 11b, as P1 moves forward, the sliding friction between point 111 and side b of whichever tooth it faces forces rack 55 to the left. When P1 has moved to a location where it is stopped by rack 55, as illustrated in FIG. 11b, rack 55 has moved ⅔ units of the aforementioned linear distance to the left, and P3 is now in the same position relative to its opposing tooth as P1 was in FIG. 11a. P3 is now pushes against side b of its facing tooth as P1 is retracted to continue to move rack 55 to the left, as shown in FIG. 11c. After P3 has moved rack ⅔ units, as shown in FIG. 11d, P2 is now similarly aligned with respect to its opposing tooth. P2 now moves forward as P3 moves backward as shown in FIG. 11e, and P1 is now facing side b of the next tooth. Repeating the 1-3-2 order of energizing the pushers causes rack 55 to continue movement to the left. In a typical MEM device, this drive can accurately move rack 55 about 2 $\mu$m per step.

Rack 55 may move to the right by reversing the order in which the pushers are energized to 3-1-2.

It should be understood that the order the pushers are arranged along rack 55 is not critical to the operation of this drive; however, the relationship between the pushers P and the teeth t is important, as discussed above. For N≧3 pushers, each pusher pressing teeth into the rack must cause rack 55 to move 1/N the distance between adjacent teeth. And the pushers must be spaced such that after each pusher has been actuated and has moved the rack, another pusher is in the same relative position to the rack as the previously actuated pusher. For example, if four pushers were used, they could be spaced to hit the teeth of the opposing rack at ¼, 2/4, ¾, and 4/4 of the distance between two teeth. To move such a system to the left, they would be energized in the order P1, P4, P3, P2, and each push would move the rack ¼ unit rather than ⅓ unit as in the three pusher example. Movement to the right would require the pushers to be energized in the order P3, P4, P1, P2.

While the teeth and pushers of FIG. 11 are shown to be identically sized isosceles triangles, it should be understood that other tooth or point shapes, such as rounding the points or varying the size of the teeth relative to the pushers, is contemplated so long as the principle of operation outlined above is followed.

In addition, to prevent backlash from rack 55, it is also preferred that the movement of the teeth be coordinated so that the teeth of one pusher are always engaging the teeth of rack 55. In other words, P1 does not retract in FIG. 11c until P3 has moved forward in contact with rack 55. In this manner, the weight of platform 5 cannot push rack 55 backwords as could happen if all teeth were disengaged.

FIG. 12 shows a preferred embodiment of an assembly of the drive of FIG. 11. Triangle 115 corresponds to bridge 56 of FIG. 4 of the '670 Rodgers patent and connects to an electrostatic comb generator 150 as taught by that patent. Linkage arm 118 is moved away from or back towards bridge 115 by the comb generator, and slides between parallel spaced guides 117 and 119. The end of arm 118 contains a plurality of teeth 120 spaced identically to the spacing of teeth 132 in rack 130. There is one such assembly for each pusher P.

Each of rack 130 and arm 120 are seen to have two stacked rows of teeth to ensure engagement of these pieces. Rack 130 slides on layer 110 within an L-shaped bracket 134 that has a vertical portion 138 affixed to the layer 110 and a horizontal portion 136 spaced from layer 110. This construction ensures that when each arm 118 pushes against rack 130, the rack is firmly constrained by vertical portion 138 from moving out of its longitudinal path. Although bracket 134 is shown as extending the length of rack 130, it should be understood that bracket 134 could also be formed in sections spaced adjacent each arm 118, as shown in FIG. 11.

In the embodiment of FIG. 12, the width of rack 130 from tooth tip to the back of support 134 is 38 microns, and the tooth pitch is 6 microns. Accordingly, the smallest full step using three pushers is 2 microns/step. The device has been tested at 1000 steps/sec (or 2 mm/sec), but it is anticipated that it can be operated at 8 mm/sec.

It should be apparent that there are many modifications possible with this invention, as long as the concept of building a planar device that may be activated so that a portion of the device rises above the construction plane, is followed. It is intended that the scope of the invention be defined by the appended claims.

What is claimed is:

1. A micro-electro mechanical multiple degree of freedom platform assembly formed from a plurality of thin films on a substrate, comprising:

a moveable planar platform having three connection points, said connection points defining a platform triangle, said platform being capable of being moved away from the plane of said substrate;

three fixed-length linkages capable of being moved away from the plane of said substrate, each linkage having one end pivotally connected to one of said platform connection points through a platform joint, each connection point being connected to only one linkage; and each linkage having an opposed end pivotally connected to said substrate;

at least one linear drive, each drive including a traveling member capable of controlled movement along a linear path adjacent said substrate; and each traveling member being pivotally connected to an opposed end of one of said linkages through a base joint, each linkage being connected to only one traveling member;

wherein when each of said opposed ends are in a predetermined position, said linkages and said platform are coplanar to and adjacent to said substrate, and when any of said traveling members is in any other position along said linear path, at least the linkage connected to that member and said platform is neither coplanar to nor adjacent to said substrate.

2. The platform assembly of claim 1 wherein three linear paths define a drive triangle concentric with said platform triangle; and one traveling member is connected through a base joint to the opposed end of each linkage.

3. The platform assembly of claim 2 wherein each base joint comprises a hinge having a first part rigidly affixed to said traveling member and a mating part rotatable around an axis parallel to the adjacent drive path;

each platform joint comprises a hinge having a first part rigidly affixed to said platform and a mating part rotatable around an X axis parallel to the adjacent drive path;

each mating part includes a rotatable member affixed thereto, said rotatable member rotating about a Z axis perpendicular to and spaced from the X axis, and the ends of said linkages being connected to said rotatable members.

4. The platform assembly of claim 3 wherein each linkage consists of two parallel links and each mating part of each hinge has two rotatable members, each rotatable member being connected to one link.

5. The platform assembly of claim 4 wherein said joints, linkages, and substrate are silicon.

6. The platform assembly of claim 1 wherein said platform assembly is silicon.

7. The platform assembly of claim 1 wherein the three linear paths radiate from a central point, each path being spaced 120° from each other path, and the one end of each path is the end furthest from the central point.

8. The platform assembly of claim 7 wherein said platform assembly is silicon.

9. The platform assembly of claim 7 wherein each base joint comprises a hinge having a first part rigidly affixed to said traveling member and a rotatable member affixed thereto, said rotatable member rotating about a Z axis perpendicular to said substrate; and a yolk rotatably connected to said rotatable member along an X axis perpendicular to and intersecting said Z axis, said yolk having an outer surface extending around and not touching said rotatable member, and spaced ends which rotatably connect to said rotatable member along said second axis, said yolk being connected to said linkage.

10. The platform assembly of claim 7 wherein each platform joint comprises a pivoting member rigidly connected to said platform;

a receiving member adjacent and pivotally connected to said pivoting member for rotation about a Y axis extending radially from said platform;

a linkage-connecting member pivotally connected to and rotatable about said receiving member along an X axis perpendicular to and intersecting said Y axis; said linkage-connecting member being rigidly attached to an end of a linkage.

11. The platform assembly of claim 10 wherein said linkage-connecting member is a yolk having a cross-member rigidly connected to an end of a linkage; two parallel spaced end pieces extending from said cross-member; and a pair of axially aligned pins, one pin extending from each end piece into pockets in said receiving member along said X axis;

said receiving structure having a shape configured to fit within and not touch said yolk.

12. The platform assembly of claim 9 wherein each platform joint comprises a pivoting member rigidly connected to said platform;

a receiving member adjacent and pivotally connected to said pivoting member for rotation about a Y axis extending radially from said platform;

a linkage-connecting member pivotally connected to and rotatable about said receiving member along an X axis perpendicular to and intersecting said Y axis; said linkage-connecting member being rigidly attached to an end of a linkage.

13. The platform assembly of claim 9 wherein said platform assembly is silicon.

14. The platform assembly of claim 12 wherein said platform assembly is silicon.

15. The platform assembly of claim 9 wherein said base joint further comprises a pivoting member pivotally connected to said yolk for rotation about a Y axis perpendicular to and intersecting each of said X and Z axes.

16. The platform assembly of claim 15 wherein each platform joint comprises a hinge having a first part affixed to said platform and a second part affixed to said linkage, said first and second parts being pivotally connected to each other about an axis.

17. The platform assembly of claim 16 wherein said platform assembly is silicon.

18. The platform assembly of claim 5 wherein each traveling member is powered by an electrostatic motor affixed to said substrate.

19. The platform assembly of claim 6 wherein each traveling member is powered by an electrostatic motor affixed to said substrate.

20. The platform assembly of claim 13 wherein each traveling member is powered by an electrostatic motor affixed to said substrate.

21. The platform assembly of claim 19 wherein said traveling member is affixed to a moveable rack aligned with said drive path, said rack having a plurality of teeth extending along its length; said electrostatic motor comprising three parallel electrostatic motors, each said motor having a pusher having teeth for engaging said rack, each motor being controllable when energized to move its pusher into and out of contact with said rack teeth, said pushers being spaced along said rack such that by energizing said pushers in either of two predetermined orders, said rack can be moved in either of two directions along said drive path.

22. The platform assembly of claim 21 wherein said rack is constrained against lateral movement by a bracket adjacent each pusher, said bracket having a vertical member extending from said substrate on the opposite side of said rack from said pusher.

23. The platform assembly of claim 21 wherein for $N \geq 3$ pushers, each pusher pressing teeth into said rack causes said rack to move 1/N the distance between adjacent teeth, said pushers being spaced such that after each pusher has been actuated and has moved said rack, another pusher is in the same relative position to said rack as the previously actuated pusher.

* * * * *